US011961753B2

(12) United States Patent
Lin et al.

(10) Patent No.: US 11,961,753 B2
(45) Date of Patent: Apr. 16, 2024

(54) SUBSTRATE-BONDING DEVICE

(71) Applicant: SKY TECH INC., Hsinchu County (TW)

(72) Inventors: Jing-Cheng Lin, Hsinchu County (TW); Jung-Hua Chang, Hsinchu County (TW); Mao-Chan Chang, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 355 days.

(21) Appl. No.: 17/548,297

(22) Filed: Dec. 10, 2021

(65) Prior Publication Data

US 2023/0187248 A1   Jun. 15, 2023

(51) Int. Cl.
*H01L 21/68* (2006.01)
*H01L 21/67* (2006.01)

(52) U.S. Cl.
CPC ........ *H01L 21/68* (2013.01); *H01L 21/67132* (2013.01)

(58) Field of Classification Search
CPC ...................................................... H01L 21/68
See application file for complete search history.

(56) References Cited

U.S. PATENT DOCUMENTS 11,735,456 B2 * 8/2023 Lin .................. H01L 21/68
                                                    269/43
11,869,792 B2 * 1/2024 Lin .................. H01L 24/80

FOREIGN PATENT DOCUMENTS

WO   WO-2012/113799 A1 *  8/2012

* cited by examiner

*Primary Examiner* — Jeffry H Aftergut
(74) *Attorney, Agent, or Firm* — Chun-Ming Shih; HDLS IPR SERVICES

(57) ABSTRACT

A substrate-bonding device includes a carrier, three first aligning units, three second aligning units, a pressing plate, and two flat-edge aligners. A carrying surface of the carrier is provided with a placement area for placing a first substrate provided with a flat edge thereon. The first aligning units, the second aligning units and the flat edge aligners are disposed around the placement area. The first aligning units are configured to align the first substrate and to support a second substrate provided with a second flat edge. The second aligning units are configured to align the second substrate. The flat edge aligners are configured to contact the first and the second flat edges, to position and align the first and the second substrates. The pressing plate is disposed to face the placement area for pressing the first and second substrates. The flat edge aligners move along with the pressing plate.

20 Claims, 10 Drawing Sheets

SUBSTRATE-BONDING DEVICE

TECHNICAL FIELD

The present disclosure relates to a substrate-bonding device, which can position two substrates fast and precisely, for bonding the two well-aligned substrates together.

BACKGROUND

As semiconductor technology evolves, wafers become thinner for convenience of later processes as the dicing and packaging processes. Therewith, chips made from the thin wafers also become smaller, such that to facilitate reducing electrical resistance, boosting calculation speed and also prolonging life cycle of products. However, the thinned wafers have relatively vulnerable structures, which may easily deform or break off during the processes, and hence to result in an undesired, low quality of the products.

To prevent the abovementioned drawback, a common method is to temporarily bond the wafer to a substrate which carries on and structural supports the wafer.

To be specific, the method is to coat adhesive on surfaces of the wafer and the substrate, then to position and align the wafer and the substrate by a substrate-bonding device. Meanwhile the substrate and the wafer are heated to facilitate the adhesive bonding therebetween. After the bonding process is complete, the wafer on the substrate may be processed with several processes, such as thinning, etching and metallization process, etc., before being removed, separate from the substrate.

Although the bonding process for combining the wafer with the substrate is effective, still, with a substrate-bonding device which performs low accuracy and precision, the drawback of the undesired, low product quality may remain unsolved.

SUMMARY

To overcome the abovementioned drawbacks, the present disclosure provides a substrate-bonding device, which can align substrates (or wafers) to proper positions and angles, then thereafter to press and bond those well-aligned the substrates together via the pressing mechanism, such that to improve efficiency of aligning and bonding the substrates.

At least one embodiment of the present disclosure provides a substrate-bonding device. The substrate-bonding device includes a carrier, at least three first aligning units, at least three second aligning units and at least two flat-edge aligners. The first aligning units, the second aligning units, and the at least two flat-edge aligners are disposed on the carrier. The flat-edge aligners are configured to contact flat edges of the first substrate and a second substrate. The first aligning units and second aligning units are for respectively aligning the first and second substrates. Thereby, the first substrate can be well-aligned with the second substrate.

The pressing mechanism is disposed to face a carrying surface of the carrier, and is movable with respect to the carrier. The pressing mechanism includes a pressing plate for pressing the two aligned substrates which are placed on the carrier. On the other side, the flat-edge aligners are configured to ascend or descend with respect to the carrying surface of the carrier, along with the pressing plate of the pressing mechanism.

In at least one embodiment, each of the flat edge positioners or the notch aligner is an alignment rod. The alignment rod is disposed in parallel to the carrying surface of the carrier in an extendable manner. The alignment rod is configured to contact and align flat edges of the first and the second substrates formed in different sizes; that is to say, the substrate-bonding device according to the present disclosure is adapted to substrates formed in different sizes.

In at least one embodiment, each of the flat-edge positioners or the notch aligner is an alignment bar. The carrying surface of the carrier is provided with two or more sets of the alignment bars disposed thereon. On the carrying surface of the carrier, one set of the alignment bars are disposed at radially internal positions with respect to another set of the alignment bars, and adapted to the flat edges or notches of the substrates formed in relatively small sizes. In the other hand, the another set is disposed at radially external positions on the carrying surface, and adapted to the flat edges or notches of the substrates formed in relatively large sizes.

At least one embodiment of the present disclosure provides a substrate-bonding device. The substrate-bonding device includes a carrier, at least three first-aligning units, at least three second-aligning units and at least one notch aligner. The at least three first-aligning units, the at least three second-aligning units and the at least one notch aligner are disposed on the carrier. The notch aligner is configured to contact and engage notches of the first and second substrates. The first and second-aligning units are configured to respectively align the first and second substrates, such that the first substrate is well-aligned with the second substrate.

In at least one embodiment, the present disclosure provides a substrate-bonding device, which includes: a carrier including a carrying surface for carrying a first substrate, wherein the carrying surface is provided with a placement area, the first substrate is provided with a first angular feature, and the first angular feature is a first flat edge or a first notch; at least three first positioning units disposed around the placement area of the carrying surface, for approaching or leaving the placement area, and for aligning the first substrate and carrying a second substrate, wherein the second substrate is provided with a second angular feature, the second angular feature is a second flat edge or a second notch, and each of the first positioning units includes a protruding portion and a lower portion, the protruding portion protrudes from the lower portion and toward the placement area, and the lower portion is disposed nearer to the carrying surface of carrier than the protruding portion is and for aligning the first substrate; at least three second positioning units disposed around the placement area on the carrying surface for approaching or leaving the placement area, and for aligning the second substrate carried by the first positioning units; a pressing plate facing the carrying surface of the carrier and movable with respect to the carrier, wherein the pressing plate is for pressing the first substrate and the second substrate stacked together on the carrier; and a plurality of flat edge positioners disposed around the placement area on the carrying surface for contacting the first flat edge of the first substrate and the second flat edge of the second substrate, wherein the flat edge positioners ascend or descend with respect to the carrying surface of the carrier, along with the pressing plate.

At least one embodiment of the present disclosure provides a substrate-bonding device, which includes: a carrier having a carrying surface for carrying a first substrate, wherein the carrying surface is provided with a placement area, the first substrate is provided with a first notch; at least three first positioning units disposed around the placement area of the carrying surface, for approaching or leaving the placement area, and for aligning the first substrate and carrying a second substrate, wherein the second substrate is provided with a second notch, and wherein each of the first positioning units includes a protruding portion and a lower portion, the protruding portion protrudes from the lower portion and toward the placement area, and the lower portion is disposed nearer to the carrying surface of carrier than the protruding portion is for aligning the first substrate; at least three second positioning units disposed around the placement area on the carrying surface for approaching or leaving the placement area, and for aligning the second substrate carried by the first positioning units; a pressing plate facing the carrying surface of the carrier and movable with respect to the carrier, wherein the pressing plate is for pressing the first substrate and the second substrate stacked together on the carrier; and plural notch positioners disposed around the placement area on the carrying surface configured to contact the first notch of the first substrate and the second notch of the second substrate, wherein the flat edge positioners ascend or descend with respect to the carrying surface of the carrier, along with the pressing plate.

At least on embodiment of the present disclosure provides a substrate-bonding device, which includes: a carrier having a carrying surface for carrying a first substrate, wherein the carrying surface is provided with a placement area, the first substrate is provided with a first angular feature, and the first angular feature is a first flat edge or a first notch; at least three positioning units disposed around the placement area of the carrying surface, for approaching or leaving the placement area, and for aligning the first substrate and carrying a second substrate, wherein the second substrate is provided with a second angular feature, and the second angular feature is a second flat edge or a second notch, and wherein the positioning units includes a protruding portion and a lower portion, the protruding portion protrudes from the lower portion and toward the placement area, and the lower portion is disposed nearer to the carrying surface of carrier than the protruding portion is, for aligning the first substrate; at least three carrying units disposed around the placement area on the carrying surface for approaching or leaving the placement area, and configured to align the second substrate carried by the positioning units; a pressing plate facing the carrying surface of the carrier and movable with respect to the carrier, wherein the pressing plate is configured to press the first substrate and the second substrate stacked together on the carrier; and a plurality of flat edge positioners disposed around the placement area on the carrying surface for contacting the first flat edge of the first substrate and the second flat edge of the second substrate, wherein the flat edge positioners ascend or descend with respect to the carrying surface of the carrier, along with the pressing plate.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
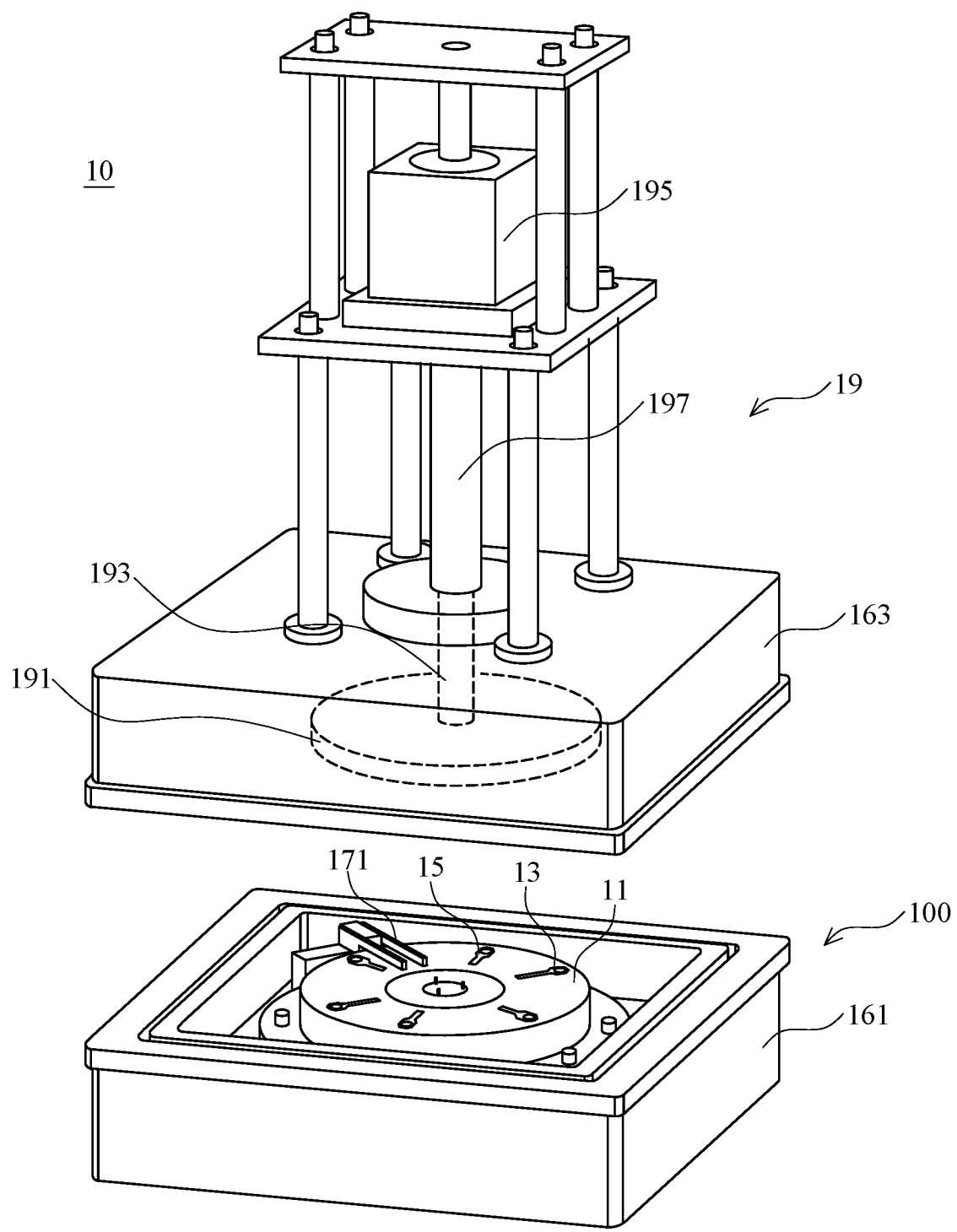
FIG. 1 is a perspective view illustrating a substrate-bonding device with an aligning mechanism according to one embodiment of the present disclosure.
Figure 2:
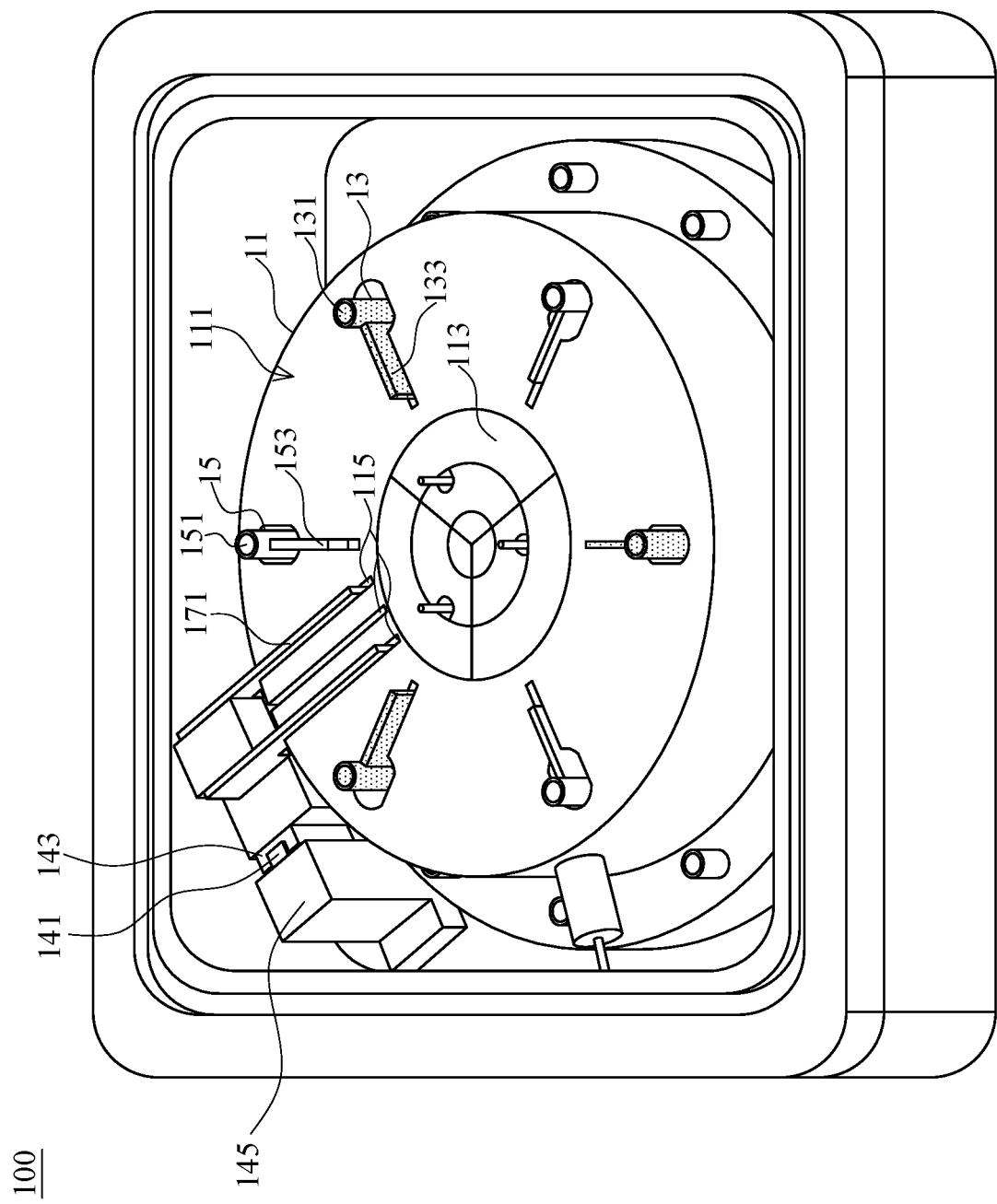
FIG. 2 is a perspective view illustrating the aligning mechanism of the substrate-bonding device, according to one embodiment of the present disclosure.

Referring to FIG. 1 and FIG. 2, FIG. 1 is a perspective view illustrating a substrate-bonding device with an aligning mechanism according to one embodiment of the present disclosure, and FIG. 2 is a perspective view illustrating an aligning mechanism of the substrate-bonding device, according to one embodiment of the present disclosure. As shown in FIGS., the substrate-bonding device 10 includes an aligning mechanism 100 and a pressing mechanism 19. The aligning mechanism 100 includes a carrier 11, three or more first aligning units 13 (three in this embodiment), three of more second aligning units 15 (three in this embodiment), and two or more flat-edge aligners 171 (two in this embodiment). In the other side, the pressing mechanism 19 is disposed above the aligning mechanism 100 and faces the carrying surface 111 of the carrier 11 in the aligning mechanism 100.

As shown in FIG. 1 and FIG. 2, the first aligning units 13, the second aligning units 15 and the flat-edge aligners 171 are disposed at an edge side or around the carrier 11. Specifically, the carrier 11 includes a carrying surface 111, and the carrying surface 111 is provided with a placement area 113 defined at middle or center of the carrying surface 111. The placement area 113 is provided for placing substrate(s) thereon. Specifically, the first aligning units 13, the second aligning units 15 and the flat-edge aligners 171 are disposed around the placement area 113.

As shown in FIG. 2, the first aligning units 13 and the second aligning units 15 are disposed around the placement area 113 on the carrying surface 111, in an alternatively arranged manner. The first aligning units 13 (dotted components in FIG. 2) are disposed around the placement area 113. The first aligning units 13 and the second aligning units 15 are movable with respect to the placement area 113, so as to move toward the carrying surface 111 along a radial axis of the placement area 113 for approaching the placement area 113, or to move away from the carrying surface 111 along a radial axis of the placement area 113 for leaving the placement area 113, for example.

The aligning mechanism 100 is configured to position and align a first substrate 121 and a second substrate 123 disposed on or above the carrier 11. The first aligning units 13 and the second aligning units 15 of the aligning mechanism 100 are respectively used to position and align a first substrate 121 and a second substrate 123, so as to stack the first substrate 121 and the second substrate 123 on each other with the second substrate 123 being aligned with the first substrate 121 during the process.

Moreover, a minimum distance between two adjacent first aligning units 13 is determined in accordance with a size of the first substrate 121, and a minimum distance between two adjacent second aligning units 15 have a minimum distance is determined in accordance with a size of the second substrate 123. Specifically, as the first substrate 121 and the second substrate 123 are proximately formed as round plates. When in an alignment position, the three first aligning units 13 are adapted to surround and fit the size and periphery of the first substrate 121, and the three second aligning units 15 are adapted to surround and fit the size and periphery of the second substrate 123.

As shown in FIG. 2, in one embodiment of the present disclosure, each of the first aligning units 13 includes a first connecting post 131 and a first alignment bar 133. The first alignment bar 133 is connected to the first connecting post 131, and the first connecting post 131 is movable to bring the first alignment bar 133 therewith in a direction parallel to and also a direction vertical to the carrying surface 111 of the carrier 11. In the other hand, each of the second aligning units 15 includes a movable second connecting post 151 (similar to the first connecting post 131) and a second alignment bar 153. The second alignment bar 153 is connected to on the second connecting post 151. In practical use, according to the size of the first substrate 121 and the second substrate 123, first alignment bars 133 and second alignment bars 153 with different size or length may be selected and sleeved the corresponded connecting posts 131, 151.

Figure 3:
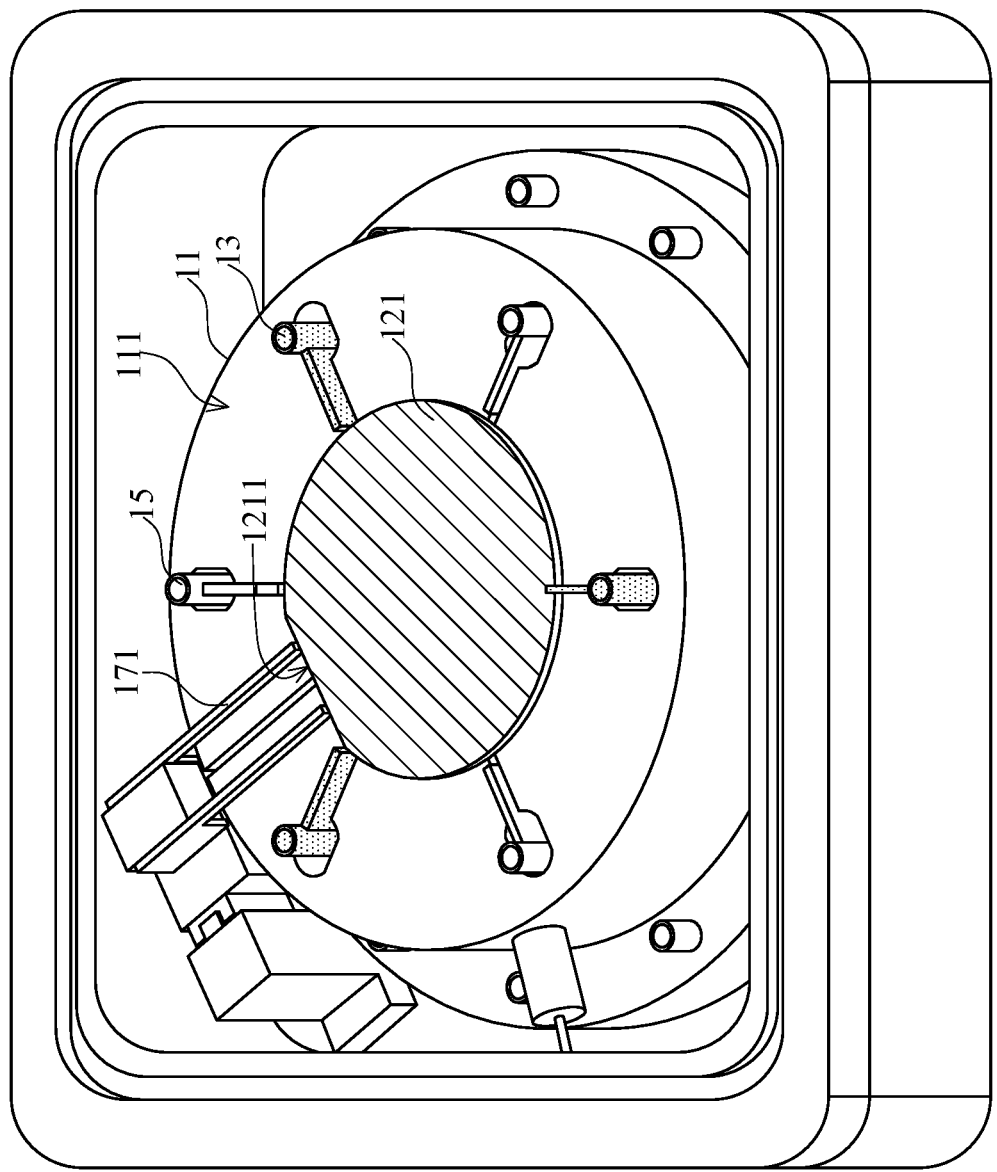
FIG. 3 is a perspective view illustrating a first substrate with a flat edge which is aligned by the aligning mechanism of the substrate-bonding device, according to one embodiment of the present disclosure.
Figure 4:
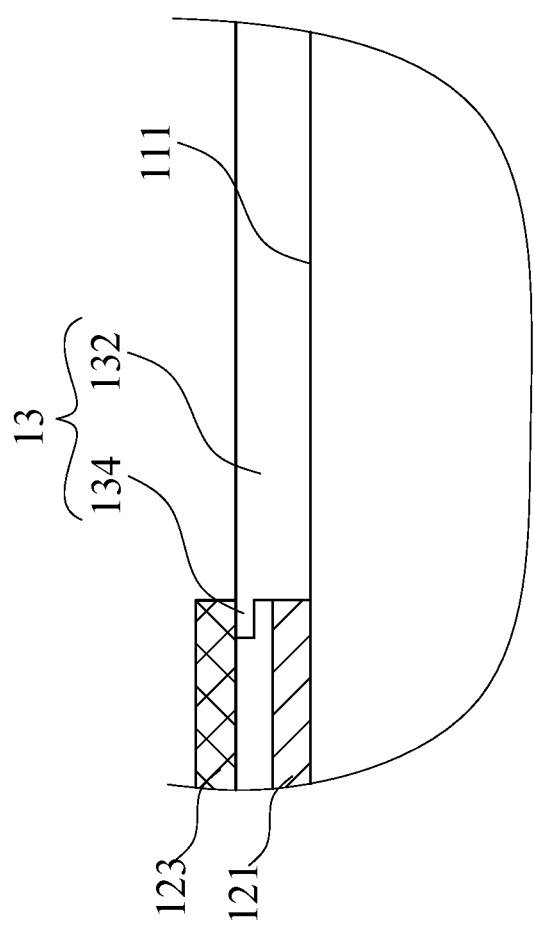
FIG. 4 is a cross-sectional view illustrating one of first aligning units of the substrate-bonding device, according to one embodiment of the present disclosure.
Figure 5:
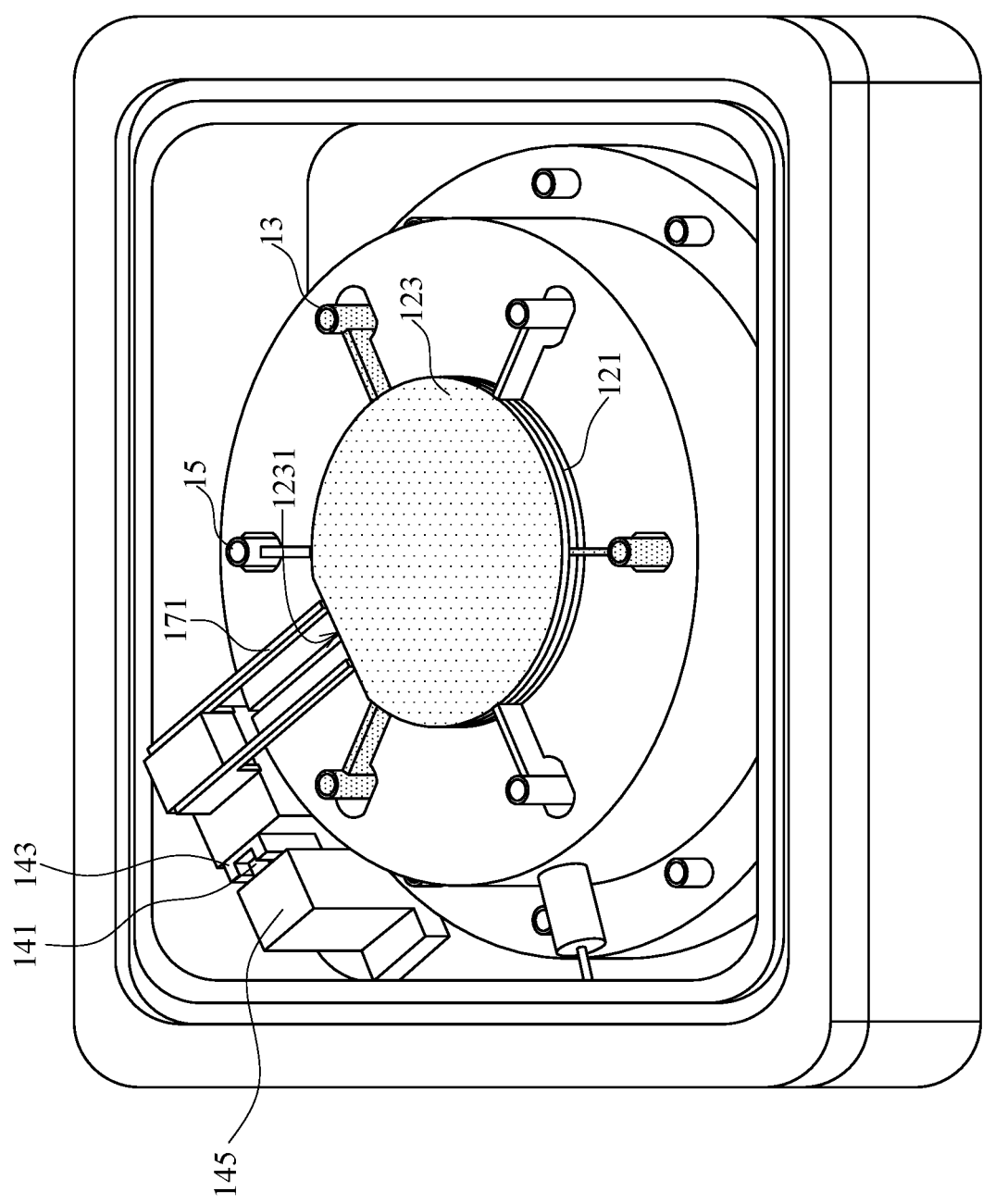
FIG. 5 is a perspective view illustrating a second substrate with a flat edge which is aligned by the aligning mechanism of the substrate-bonding device, according to one embodiment of the present disclosure.

As shown in FIG. 3, FIG. 4 and FIG. 5, the first substrate 121 and the second substrate 123 may be wafers, and the first substrate 121 is provided with a first angular feature while the second substrate 123 is provided with a second angular feature. The first angular feature and the second angular feature may be flat edges or notches formed on the wafers. As shown in FIG. 3 and FIG. 5, in this embodiment, the first substrate 121 is provided with a first flat edge 1211 to serve as the first angular feature, and the second substrate 121 is provided with a second flat edge 1231 to serve as the second angular feature. Therefore, it is able to know a tilted angle of first substrate 121 about the vertical axis of the carrying surface 111 from the first flat edge 1211 and a tilted angle of second substrate 123 about the vertical axis of the carrying surface 111 from the second flat edge 1231.

As shown in FIG. 3 and FIG. 5, the flat-edge aligners 171 are disposed around of the placement area 113 on the carrying surface 111, and the flat-edge aligners 171 are configured to contact and abut the first flat edge 1211 of the first substrate 121 and the second flat edge 1231 of the second substrate 123. Therefore, the flat-edge aligners 171 angularly or directionally align the first substrate 121 and the second substrate 123. Furthermore, with the first aligning units 13, the second aligning units 15 and the flat-edge aligners 171, the substrate-bonding device 10 is able to align the first and second substrates 121, 123 into proper position and angle.

As shown in FIG. 3, during a process of aligning and bonding the first substrate 121 and the second substrate 123, the first substrate 121 is placed on the carrying surface 111 of the carrier 11, with the first flat edge 1211 thereof facing the flat edge aligners 171. Next, the first aligning units 13 (the dotted components in FIG. 3) move in parallel to the carrying surface 111 and toward the placement area 113, so as to contact first flat edge 1211, and then to position and align the first substrate 121 on the placement area 113 or the carrying surface 111 of the carrier 11. Herein for example, defining a preset position centroid on the carrier 11 or in the placement area 113, and the first aligning units 13 can move toward or away from the position centroid in the placement area 113, for position adjustment and for aligning the first substrate 121 by contacting the peripheral edge of the first substrate 121.

To be more specific, when the first substrate 121 is placed in the placement area 113 on the carrier 11, usually the first substrate 121 is not at an accurate position or angle within the placement area 113. Therefore, the three first aligning units 13 is controlled to move toward the placement area 113 in synchronous or asynchronous manner, for contacting, repositioning and aligning the first substrate 121 within the placement area 113. Meanwhile, the flat edge-aligners 171 contacts the first flat edge 1211 of the first substrate 121, for aligning and adjusting the first substrate 121 into a proper angle, and thereby the first substrate 121 is well positioned and aligned within the placement area 113.

As shown in FIG. 4, in one embodiment of the present disclosure, for each of the first aligning units 13, the alignment bar 133 includes a lower portion 132 and a protruding portion 134. The lower portion 132 is disposed nearer to the carrying surface 111 of the carrier 11 than the protruding portion 134 is, and the protruding portion 134 protrudes from the lower portion 132 toward the placement area 113 of the carrier 11. When the first aligning units 13 move toward the first substrate 121 in the placement area, the lower portion 132 of the alignment bar 134 abuts and hence to position, align the first substrate 121.

As shown in FIG. 5, after aligning the first substrate 121 to the proper position and angle, the second substrate 123 is placed above the placement area 113 with the second flat edge 1231 thereof facing the flat edge aligners 171. Meanwhile, the first aligning units 13 stay still to retain the first substrate 121 at the proper position, and also to support and carry the second substrate 123, by the protruding portions 134 of the first aligning units 13, for example.

As shown in FIG. 5, after the second substrate 123 is placed and carried by the first aligning units 13, the second aligning units 15 move toward the placement area 113 (in parallel to the carrying surface 111 to the position centroid thereof) and the second substrate 123, to position and align the second substrate 123 (by the second alignment bar 153). Meanwhile, the flat edge aligners 171 also contact the second flat edge 1231 of the second substrate 123, for aligning and adjusting the second substrate 123 into the proper angle, and so as to align the second substrate 123 with the first substrate 121. Also to mention, in practical use, as the second aligning units 15 serve no purpose to carry substrate, therefore unlike the first alignment bar 133 of the aligning units 13, the second alignment bar 153 is not required to be provided with a protruding portion. Therefore, the configuration of the second alignment bar 153 may be formed as pins, bars or shafts with any detailed geometric shapes.

Through the abovementioned alignment steps, the second substrate 123 is aligned with and positioned above the first substrate 121. Thereafter, the first aligning units 13 leave the first substrate 121 and the second substrate 123 and/or the placement area 113 (the first aligning units 13 move in parallel to the carrying surface 111 to the radial-outer side thereof). At this moment, the second substrate 123 falls downward from the first alignment bars 133 of the first aligning units 13 and onto the first substrate 121.

In more detail, the three first aligning units 13 may leave the second substrate 123 in an asynchronous manner, so as to have one of the first aligning units 13 leave the second substrate 123 at first, and have another two of the first aligning units 13 stay still. Therefore, the second substrate 123 has a side flipping down on the first substrate 121, and thereafter, the another two first aligning units 13 then leave the second substrate 123, thereby to allow the entire second substrate 123 flatly placed on the first substrate 121. Thus, the second substrate 123 is stacked on the first substrate 121.

In one embodiment of the present disclosure, when the first aligning units 13 leave the second substrate 123, the second aligning units 15 may hold still, so as to prevent the second substrate 123 from disorientation by the first aligning units 13 moving away related the second substrate 123.

On the other side, as shown in FIG. 1, the pressing mechanism 19 includes a pressing plate 191, a connecting shaft 193 and at least one linear actuator 195. The linear actuator 195 may be a pneumatic cylinder or a motor. The pressing plate 191 is disposed to face the carrying surface 111 of the carrier 11. The linear actuator 195 is connected to the pressing plate 191 via the connecting shaft 193, for driving the pressing plate 191 to move toward the carrying surface 111 of the carrier 11, so as to press the first substrate 121 and the second substrate 123 stacked on each other. Moreover, in practical use, the carrier 11 and/or the pressing plate 191 may be further disposed with a heater (not shown), for heating up adhesive pre-coated between the first substrate 121 and the second substrate 123.

According to the present disclosure, along with the pressing mechanism 19 ascending or descending with respect to the carrying surface 111 of the carrier 11, the pressing plate 191 ascends or descends for pressing and moving with respect to the carrying surface 111 of the carrier 11, and the flat edge aligners 171 also ascends or descends along with the pressing plate 191. Also, the carrying surface 111 of the carrier 11 is provided with grooves 115 corresponding to the flat edge aligners 171. For example, when the linear actuator 195 drives the pressing plate 191 to move, descend toward the carrying surface 111 for pressing, therewith, the flat edge aligners 171 also descend with respect to the carrying surface 111 and respectively enter the grooves 115. Moreover, when entering the grooves 115, the flat edge aligners 171 are positioned lower than the carrying surface 111, so as to allow the pressing plate 191 pressing the first substrate 121 and the second substrate 123 on the carrier 11.

Figure 6:
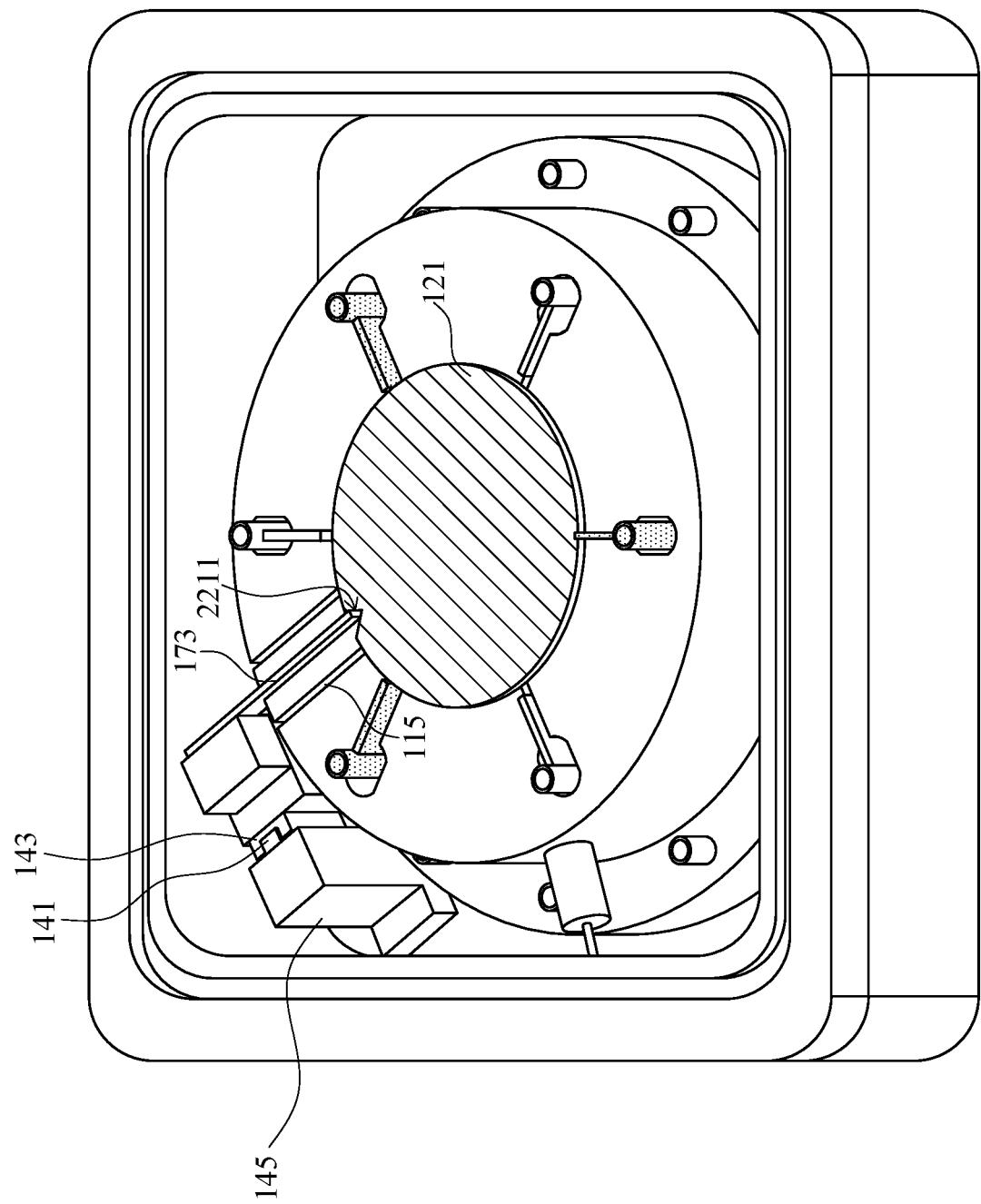
FIG. 6 is a perspective view illustrating a substrate with a notch which is aligned by a notch aligner of the substrate-bonding device, according to a different embodiment of the present disclosure.

As shown in FIG. 6, in a different embodiment, the angular features of the substrates (or wafer) 121, 123 may be notches (proximately V-shape in this embodiment). The notches include a first notch 2211 formed on an edge of the first substrate 121 and a second notch 2231 on an edge of the second substrate 123. In this embodiment, the two flat edge aligners 171 are replaced by a single notch aligner 173. The notch aligner 173 is adapted to contact the first substrate 121 and the second substrate 123 by engaging into the first notch 2211 and the second notch 2231, so as to position and align the first substrate 121 and the second substrate 123 into the proper angle or direction. Also, the notch aligner 173 is configured to ascend or descend along with the pressing plate 191, and moreover, the carrying surface 111 of the carrier 11 is provided with another groove 115 (such as a middle groove in FIG. 2) for the notch aligner 173 to enter.

In one embodiment of the present disclosure as shown in FIG. 2, the flat-edge aligners 171 and/or the notch aligner 173 is connected to a resilient unit 141 (e.g. spring). When the pressing plate 191 descends toward the carrying surface 111 and contacts the flat edge aligners 171 or the notch aligner 173, the resilient unit 141 deforms to generate recovery force as the aligners 171, 173 being pressed by the pressing plate 191 and descend into the carrying surface 111 (the grooves 115). In opposite manner, when the pressing plate 1941 ascends and leaves the flat edge aligners 171 and/or the notch aligner 173, the resilient unit 141 is unloaded and hence to recover, and so as to bring the aligners 171, 173 back out of the carrying surface 111, for aligning and positioning the flat edges 1211, 1231 or the notches 2211, 2231 of the substrates 171, 173.

In an alternative embodiment of the present disclosure, the flat edge aligners 171 and/or the notch aligner 173 is connected to an elevating unit 143 (e.g. pneumatic cylinder or motor). The elevating unit 143 is adapted for driving the aligners 171, 173 to ascend or descend with respect to the carrying surface 111. To be specific, when the pressing plate 191 descends toward the carrying surface 111 to approach or contact the flat edge aligners 171 and/or the notch aligner 173, the elevating unit 143 also drives the aligners 171, 173 to descend into the carrying surface 111. When the pressing plate 191 ascends, the elevating unit 143 also drives the aligners 171, 173 to ascend back and out of the carrying surface 111. Moreover, the elevating unit 143 may be configured to drive the aligners 171, 173 to descend with the pressing plate 191, in a synchronous manner. In a different manner of operation, the elevating unit 143 may first drive the aligners 171, 173 to descend, thereafter the pressing plate 191 then descend to press and bond the first and second substrates 121, 123.

In more detail, the flat edge aligners 171 and/or the notch aligner 173 are bar-like alignment rods, therewith, the carrier 11 is provided with long grooves 115. The aligners 171, 173 are partially disposed within the corresponding grooves 115, and movable (ascend or descend) with respect to the carrying surface 111 of the carrier 11 along the grooves 115.

The resilient unit 141 and/or the elevating unit 143 is (are) disposed aside of the carrier 11, and connected to the flat edge aligners 171 and/or the notch aligner 173. Flat-edge aligners 171 and/or notch aligner 173 in different lengths, sizes may be selected and be mounted on the platform which is connected to the resilient unit 141 and/or the elevating unit 143, such that the flat-edge aligners 171 and/or the notch aligner 173 are adapted to align flat edge and/or notch of substrate(s) formed in different sizes. In a different embodiment, each of the flat-edge aligners 171 and/or the notch aligner 173 is provided with a plurality of mounting holes or long slot, such that aligners 171, 173 can be mounted on the platform in different positions to adjust ranges, reaches thereof along the carrying surface 111 of the carrier 11, in order to adapt the substrate(s) in different sizes.

Also as shown in FIG. 1, the substrate-bonding device 10 may include a container 161, and a lid 163. The lid 163 faces and connects to the container 161, so as to form a closed space therebetween. The aligning mechanism 100 is disposed within the container 161, and the pressing plate 191 is disposed within the lid 163.

When the lid 163 covers and connects to the container 161, the aligning mechanism 100 and the pressing plate 191 is positioned within the closed space formed therebetween. The container 161 or the lid 163 may be connected to a gas-extraction unit (e.g. vacuum pump), so as to extract and remove gas out of the closed space between the container 161 and the lid 163.

Referring to FIG. 1, in one embodiment of the present disclosure, the linear actuator 195 is mounted on a frame (not shown), and is connected to the lid 163 via the driver shaft 197, so as to drive the lid 163 to move toward and connect to the container 161. The driver shaft 197 may be a hollow tube, with the connecting shaft disposed therein, for example. In a different embodiment, the connecting shaft 193 may be disposed outside of the driver shaft 197, and be driven by another linear actuator to move the pressing plate 191.

In practical use, the lid 163 may be driven to connect the container 161 for forming the closed space; then, gas within the closed space is extracted out by the gas-extraction unit, thereafter the aligning and bonding processes is performed to the first substrate 121 and the second substrate 123.

Moreover, according to the two flat-edge aligners 171 and one notch aligner 173 which are provided with bar-like appearances, three grooves 115 are formed at an edge side of the carrying surface 111 of the carrier 11. As shown in FIG. 2, two of the grooves 115 on two lateral sides are for respectively being engaged by the two flat-edge aligners 171, and as shown in FIG. 6, the groove 115 at middle is for being engaged by the notch aligner 173.

The flat-edge aligners 171 may be replaced by the single notch aligner 173. Among the two flat-edge aligners 171, by dismounting one of the two flat-edge aligners 171 and positon-adjusting the other flat-edge aligner 171 to a position corresponding to the middle groove 115, the remaining flat-edge aligner 171 may serve as the notch aligner 173. Moreover, in practical use, the resilient unit 141 or the elevating unit 143 may be mounted on a slide rail, and driven to move by a drive unit 145 (e.g. pneumatic cylinder or motor), so as to move the flat-edge aligners 171 and/or the notch aligner 173 between the three grooves 115.

In other embodiment, the carrying surface 111 of the carrier 11 may be provided with only two grooves 115 for respectively being engaged the two flat-edge aligners 171. One of the two flat-edge aligners 171 and the corresponding groove 115 is pre-configured corresponding to a midpoint of the first flat edge 1211 of the first substrate 121. With such configuration, the flat-edge aligners 171 can be switched into the notch aligner 173, by simply dismounting the other first flat edge 1211 which is not pre-configured corresponding to the midpoint of the flat-edge aligners 171; thereby the flat-edge aligner 171 for aiming the midpoint becomes the notch aligner 173.

Figure 7:
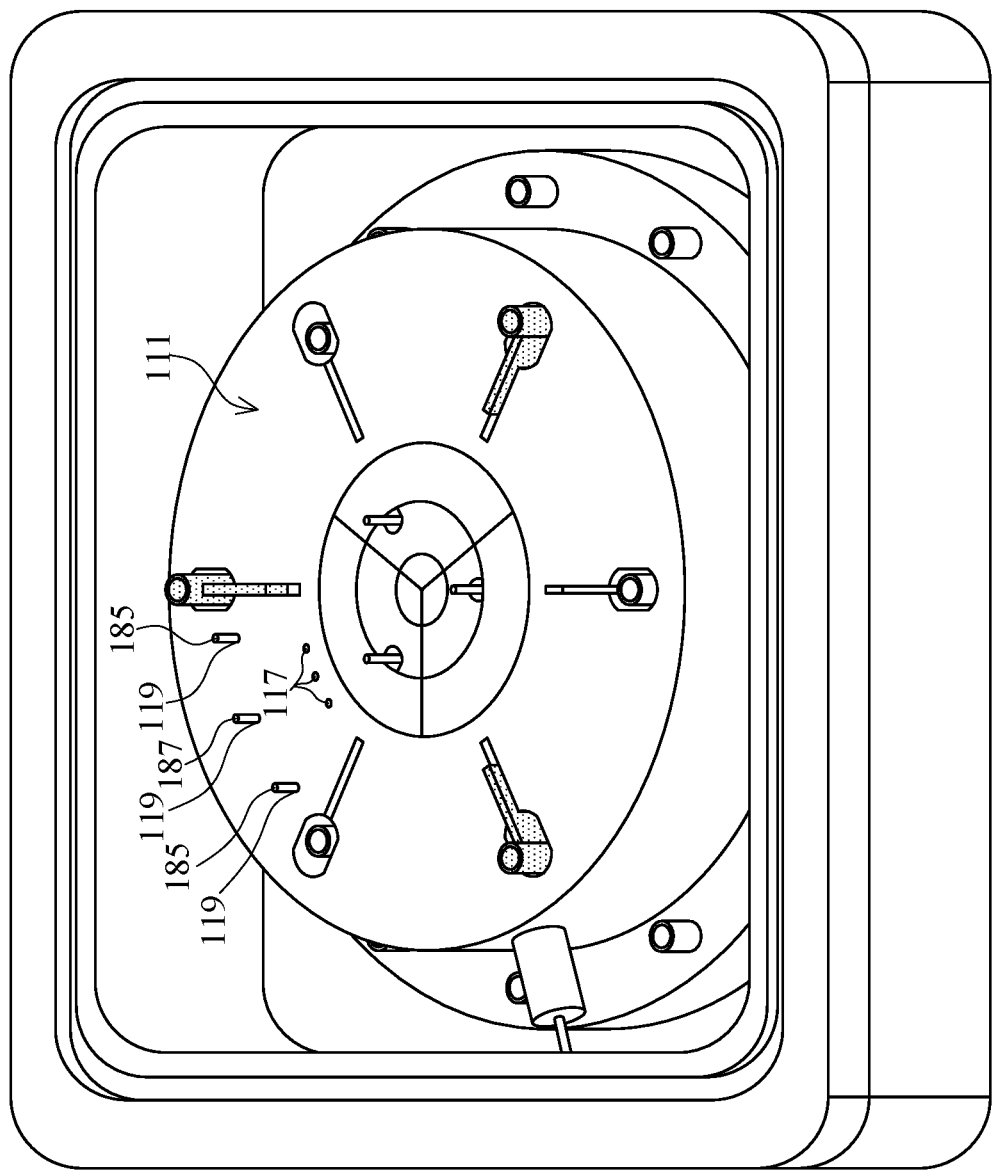
FIG. 7 is a perspective view illustrating the aligning mechanism of the substrate-bonding device, according to another embodiment of the present disclosure.
Figure 8:
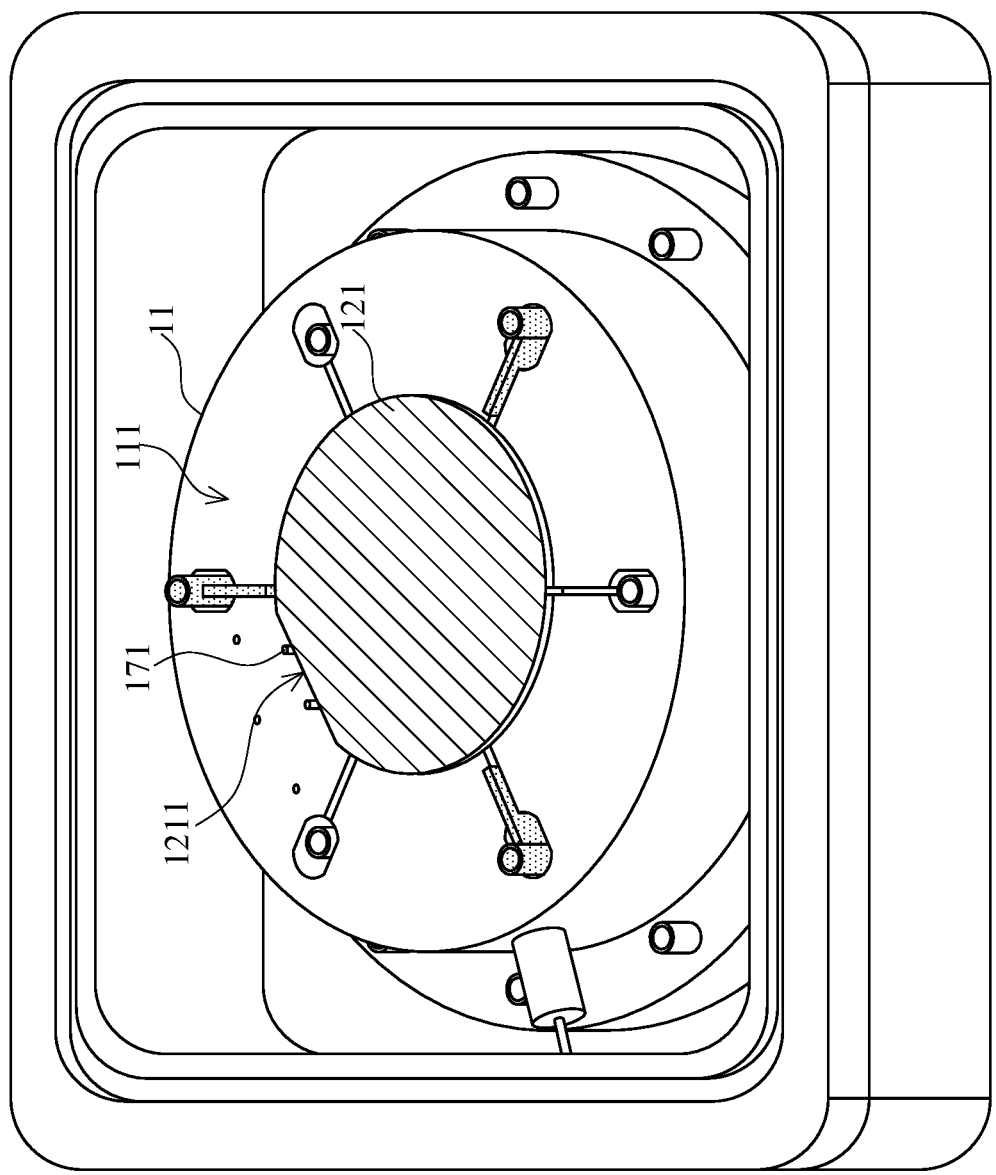
FIG. 8 is a perspective view illustrating the substrate with the flat edge which is aligned by the aligning mechanism of the substrate-bonding device, according to another embodiment of the present disclosure.
Figure 9:
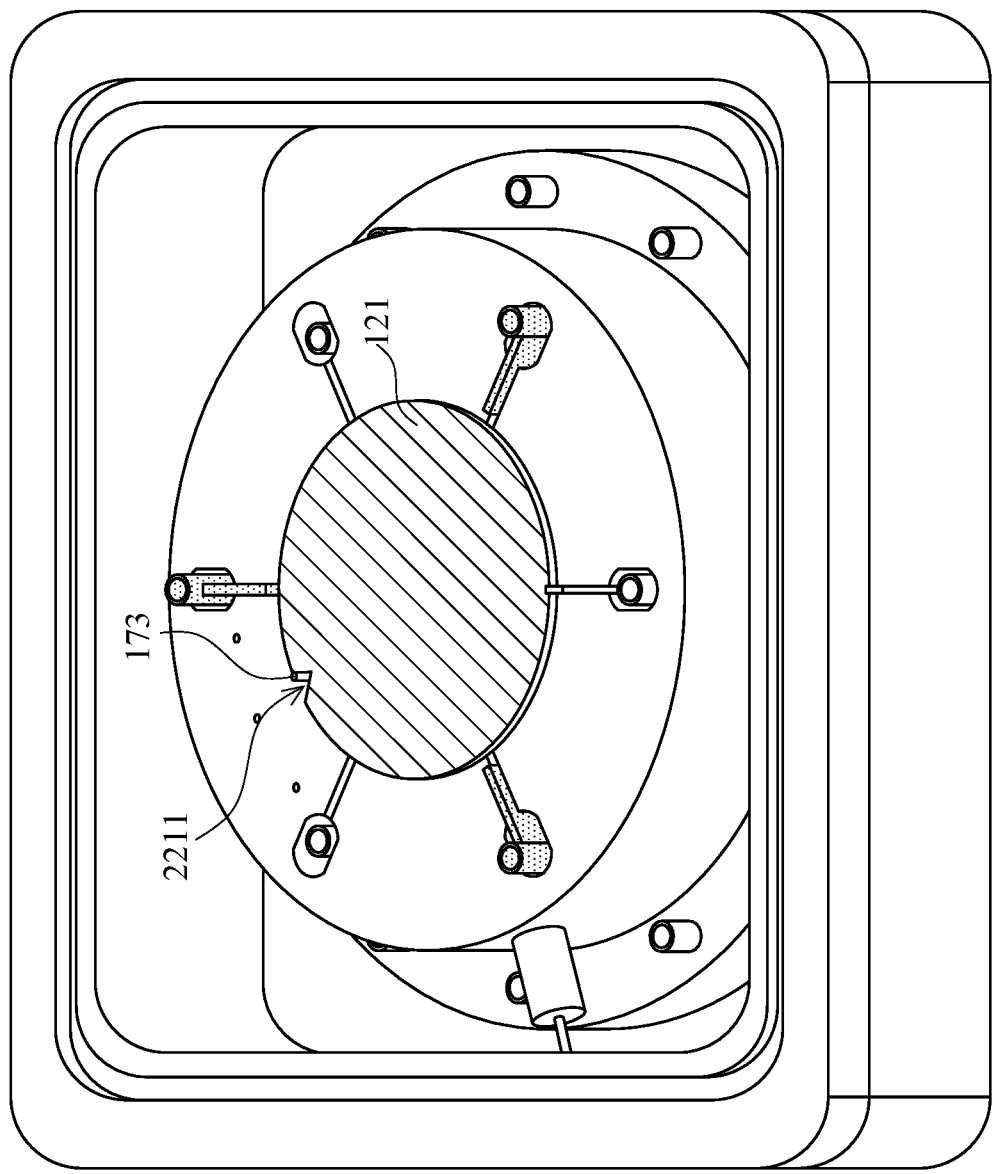
FIG. 9 is a perspective view illustrating the substrate with the notch which is aligned by the aligning mechanism of the substrate-bonding device, according to another embodiment of the present disclosure.

As shown in FIG. 7, FIG. 8 and FIG. 9, in another embodiment of the present disclosure, the flat-edge aligners 171 include edge-aligning posts 181, 185 and the notch aligner 173 includes notch-aligning post 183, 187. Therewith, the carrying surface 111 of the carrier 11 is provided with two sets of holes 117, 119. One set of the holes 117 includes three first holes 117 and another set of holes 119 includes three second holes 119. On the carrying surface 111, the three second holes 119 are at radially external positions with respect to the three first holes 117. Each of the holes 117, 119 is provided with an edge-aligning post 181, 185 disposed therewith, and the posts 181, 185, 183, 187 are able to extend out from the holes 117, 119, or return to the holes 117, 119.

As shown in FIG. 8, two of the first holes 117 respectively on two lateral sides are respectively provided with one of two first edge-aligning posts 181 disposed therewith. The two first edge-aligning posts 181 can protrude from the carrying surface 111, for contacting and aligning the first flat edge 1211 of the first substrate 121 and/or the second flat edge 1231 of the second substrate 123.

As shown in FIG. 9, a middle one of the first holes 117 is provided with a first notch-aligning post 183 disposed therewithin, such that the first notch-aligning post 183 is located between the two first edge-aligning posts 181. The first notch-aligning posts 183 can protrude from the carrying surface 111, for engaging and aligning the first notch 2211 of the first substrate 121 and/or the second notch 2231 of the second substrate 123.

As shown in FIG. 7, among the three second holes 119, two of the second holes 119 on two lateral sides are respectively provided with two second edge-aligning posts 185 disposed therewithin, and the second hole 119 at middle is provided with a second notch-aligning post 187 disposed therein. The second notch-aligning post 187 is located between the two second edge-aligning posts 185. The second edge-aligning posts 185 and the second notch-aligning post 187 are at radially external positions with respect to the first edge-aligning posts 181 and the first notch-aligning post 183, on the carrying surface 111, for positioning and aligning substrate(s) in relatively large size.

The first edge-aligning post 181, the first notch-aligning post 183, the second edge-aligning posts 185 and the second notch-aligning post 187 may be connected to a resilient unit or elevating unit (similar to the aforementioned resilient unit 141 and elevating unit 143) disposed within the carrier 11 and under the carrying surface 111, thereby all of the aligning posts 181, 183, 185, 187 can extend (ascend) from or return to (descend) the carrying surface 111, in correspondence to the movement of the pressing plate 191, in a synchronous or asynchronous manner.

Figure 10:
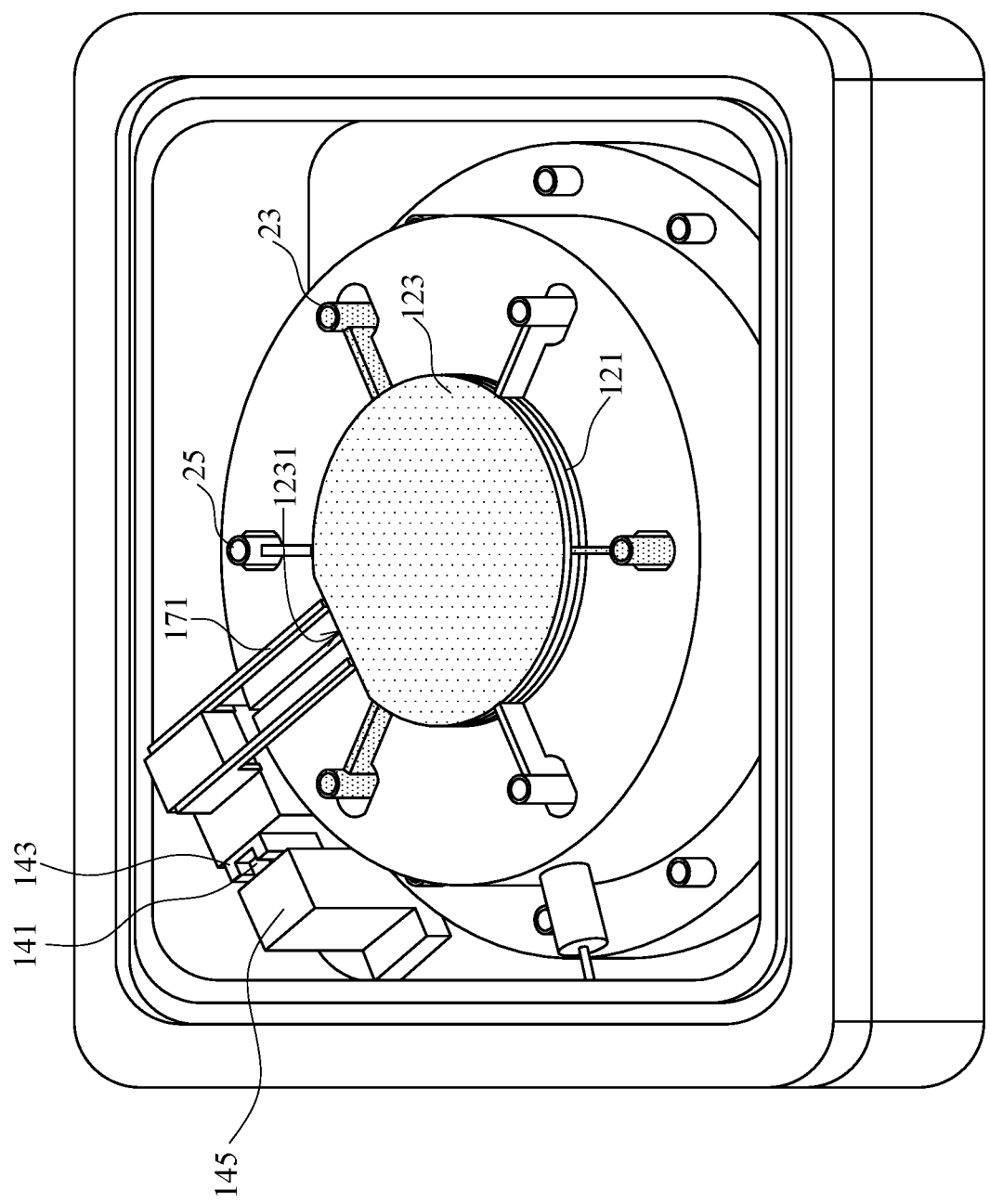
FIG. 10 is a perspective view illustrating an alternative configuration of the aligning mechanism of the substrate-bonding device, according to another embodiment of the present disclosure.

In another alternative configuration, as shown in FIG. 10, the first aligning units 13 may serve as support units 23, and the second aligning units 15 may serve as aligning units 25. Also, similar to aforementioned embodiments, number of the support units 23 and number of the aligning units 25 may be three or more.

The three support units 23 and the three aligning units 25 are disposed around the placement area 113 on the carrying surface 111, for approaching or leaving the placement area 113. In this embodiment, the aligning units 25 serve to position, align the first substrate 121 and the second substrate 123, and the support units 23 serve to support and carry up the second substrate 123, before stacking the second substrate 123 on the first substrate 121.

In practical use, at first, the first substrate 121 is placed in the placement area 113 on the carrying surface 111, next, the aligning units 25 are controlled to approach the first substrate 121 in the placement area 113, such that to position and align the first substrate 121.

After the first substrate 121 is well-aligned, the three support units 23 is then controlled to approach the first substrate 121, and then the aligning units 25 leave the first substrate 121. Thereafter, the second substrate 123 is placed on and supported by the support units 23 (by the protruding portion), and hence no contact with the first substrate 121 below. Specifically, each of the support units 23 includes the protruding portion, which is structurally similar to the protruding portions 134 of the first aligning units 13, thereby the support units 23 can serve to support and retain the second substrate 123.

Thereafter, the aligning units 25 is again controlled to approach then contact, align the second substrate 123 retained by the support units 23, thereby the second substrate 123 is aligned with the first substrate 121 and/or the placement area 113, and ready for the later pressing and bonding process.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A substrate-bonding device, comprising:
   a carrier, including a carrying surface for carrying a first substrate; wherein the carrying surface is provided with a placement area, the first substrate is provided with a first angular feature, and the first angular feature is a first flat edge or a first notch;
   at least three first aligning units disposed around the placement area of the carrying surface, for approaching or leaving the placement area, so as to align the first substrate and to support a second substrate provided with a second angular feature which is a second flat edge or a second notch; wherein each of the at least three first aligning units includes a lower portion and a protruding portion protruding from the lower portion toward the placement area, for each of the at least three first aligning units, the lower portion is disposed nearer to the carrying surface than the protruding portion is, and the lower portion is configured to align the first substrate;
   at least three second aligning units disposed around the placement area of the carrying surface, for approaching or leaving the placement area, so as to align the second substrate supported by the at least three first aligning units;
   a pressing plate facing the carrying surface of the carrier and movable with respect to the carrier, for pressing the first substrate and the second substrate stacked on each other on the carrying surface of the carrier; and
   a plurality of flat-edge aligners disposed aside of the placement area of the carrying surface for contacting the first flat edge of the first substrate and the second flat edge of the second substrate; wherein the plurality of flat-edge aligners are movable to ascend or descend with respect to the carrying surface along with the pressing plate.

2. The substrate-bonding device according to claim 1, further comprising a notch aligner for contacting the first notch of the first substrate and the second notch of the second substrate; wherein the notch aligner is movable to ascend or descend with respect to the carrying surface of the carrier along with the pressing plate.

3. The substrate-bonding device according to claim 2, wherein a number of the plurality of flat-edge aligners is two, the carrying surface of the carrier is provided with three grooves aside of the placement area, the two flat-edge aligners are respectively disposed within two lateral ones of the three grooves, and the notch aligner is disposed within a middle one of the grooves.

4. The substrate-bonding device according to claim 2, wherein the plurality of flat-edge aligners include two flat-edge posts, the carrying surface of the carrier is provided with three first holes aside of the placement area of the carrying surface, the two first edge-aligning posts respectively disposed within two lateral ones of the three first hole; the notch aligner includes a first notch-aligning post, and the first notch-aligning post is disposed within a middle one of the first holes.

5. The substrate-bonding device according to claim 4, wherein the carrying surface of the carrier is further provided with three second holes; the three second holes are at radially external positions with respect to the three firsts holes; and the plurality of flat-edge aligners further include two second edge-aligning posts respectively disposed within two lateral ones of the three second hole; and the notch aligner further includes a second notch-aligning post disposed within a middle one of the three second holes.

6. The substrate-bonding device according to claim 1, further comprising an elevating unit connected to the plurality of flat-edge aligners, for moving the plurality flat-edge aligners to ascend or descend with respect to the carrying surface of the carrier.

7. The substrate-bonding device according to claim 1, further comprising at least one resilient unit connected to the plurality of flat-edge aligners; wherein when the pressing plate approaches the carrying surface to contact the plurality of flat-edge aligners, the at least one resilient unit deforms to allow the plurality of flat-edge aligners and the pressing plate to simultaneously move with respect to the carrying surface.

8. A substrate-bonding device, comprising:
   a carrier including a carrying surface for carrying a first substrate; wherein the carrying surface is provided with a placement area, and the first substrate is provided with a first notch;
   at least three first aligning units disposed around the placement area of the carrying surface, for approaching and leaving the placement area, for aligning the first substrate, and for supporting a second substrate provided with a second notch; wherein each of the at least three first aligning units includes a lower portion and a protruding portion protruding from the lower portion toward the placement area, and for each of the at least three first aligning units the lower portion is disposed nearer to the carrying surface than the protruding portion is, and the lower portion is configured to align the first substrate;
   at least three second aligning units disposed around the placement area of the carrying surface for approaching or leaving the placement area, and for aligning the second substrate supported by the at least three first aligning units;
   a pressing plate facing the carrying surface of the carrier and movable with respect to the carrier, for pressing the first substrate and the second substrate stacked on each other on the carrying surface; and
   at least one notch aligner for contacting the first notch of the first substrate and the second notch of the second substrate; wherein the at least one notch aligner is movable to ascend or descend with respect to the carrying surface along with the pressing plate.

9. The substrate-bonding device according to claim 8, further comprising an elevating unit connected to the at least one notch aligner, for moving the at least one notch aligner to ascend or descend with respect to the carrying surface of the carrier.

10. The substrate-bonding device according to claim 8, further comprising at least one resilient unit connected to the at least one notch aligner; wherein when the pressing plate approaches the carrying surface to contact the at least one notch aligner, the at least one resilient unit deforms to allow the at least one notch aligner to simultaneously move with respect to the carrying surface along with the pressing plate.

11. The substrate-bonding device according to claim 8, wherein the carrying surface of the carrier is provided with at least one groove aside of the placement area, and the at least one notch aligner is disposed within the at least one groove.

12. The substrate-bonding device according to claim 8, wherein the carrying surface of the carrier is provided with at least one first holes aside of the placement area of the carrying surface; and the at least one notch aligner comprises a first notch-aligning post disposed within the first holes.

13. The substrate-bonding device according to claim 12, wherein the carrying surface of the carrier is further provided with at least one second hole; the at least one second hole is at a radially external position with respect to the at least one first hole; and the at least one notch aligner further comprises a second notch-aligning post disposed within the at least one second hole.

14. A substrate-bonding device, comprising:
  a carrier including a carrying surface for carrying a first substrate; wherein the carrying surface is provided a placement area, and the first substrate is provided with a first angular feature as a first flat edge or a first notch;
  at least three aligning units disposed around the placement area of the carrying surface for approaching or leaving the placement area to align the first substrate and a second substrate; wherein the second substrate is provided with a second angular feature, and the second angular is a second flat edge or a second notch;
  at least three support units disposed around the placement area of the carrying surface, for approaching or leaving the placement area and for supporting the second substrate; wherein each of the at least three support units includes a lower portion and a protruding portion protruding from the lower portion toward the placement area, and for each of at least three support units, the lower portion is disposed nearer to the carrying surface than the protruding portion is;
  a pressing plate facing the carrying surface and movable with respect to the carrier for pressing the first substrate and the second substrate stacked on each other on the carrying surface of the carrier; and
  a plurality of flat-edge aligners disposed aside of the placement area of the carrying surface for contacting the first flat edge of the first substrate and the second flat edge of the second substrate; wherein the plurality of flat-edge aligners are movable to ascend or descend with respect to the carrying surface along with the pressing plate.

15. The substrate-bonding device according to claim 14, further comprising a notch aligner for contacting the first notch of the first substrate and the second notch of the second substrate, wherein the notch aligner is movable to ascend or descend with respect to the carrying surface of the carrier along with the pressing plate.

16. The substrate-bonding device according to claim 15, wherein a number of the plurality of flat-edge aligners is two, the carrying surface of the carrier is provided with three grooves aside of the placement area, the two flat-edge aligners are respectively disposed within two lateral ones of the three grooves on two lateral sides, and the notch aligner is disposed within a middle one of the grooves.

17. The substrate-bonding device according to claim 15, wherein the carrying surface of the carrier is provided with three first holes aside of the placement area of the carrying surface, the plurality of flat-edge aligners include two first edge-aligning posts respectively disposed within two lateral ones of the three first hole; and the notch aligner includes a first notch-aligning post disposed within a middle one of the first holes.

18. The substrate-bonding device according to claim 15, wherein the carrying surface of the carrier is further provided with three second holes, the three second holes are at radially external positions with respect to the three firsts holes, the plurality of flat-edge aligners further include two second edge-aligning posts respectively disposed within two lateral ones of the three second hole, and the notch aligner further includes a second notch-aligning post disposed within a middle one of the three second holes.

19. The substrate-bonding device according to claim 14, further comprising at least one resilient unit that is connected to the plurality of flat-edge aligners; wherein when the pressing plate approaches the carrying surface to contact the plurality of flat-edge aligners, the at least one resilient unit deforms to allow the plurality of flat-edge aligners simultaneously move with respect to the carrying surface along with and the pressing plate.

20. The substrate-bonding device according to claim 14, further comprising an elevating unit that is connected to the plurality of flat-edge aligners, for moving the plurality of flat-edge aligners to ascend or descend with respect to the carrying surface of the carrier.

* * * * *